(12) United States Patent
Renard et al.

(10) Patent No.: US 9,362,842 B2
(45) Date of Patent: Jun. 7, 2016

(54) POWER DIMMER

(71) Applicant: STMicroelectronics (Tours) SAS, Tours (FR)

(72) Inventors: Benoit Renard, Saint-Cyr-sur-Loire (FR); Laurent Gonthier, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 98 days.

(21) Appl. No.: 14/364,857

(22) PCT Filed: Nov. 6, 2012

(86) PCT No.: PCT/FR2012/052555
§ 371 (c)(1),
(2) Date: Jun. 12, 2014

(87) PCT Pub. No.: WO2013/072602
PCT Pub. Date: May 23, 2013

(65) Prior Publication Data
US 2015/0023078 A1 Jan. 22, 2015

(30) Foreign Application Priority Data
Nov. 15, 2011 (FR) ...................................... 11 60367

(51) Int. Cl.
*H02M 1/14* (2006.01)
*H02M 7/155* (2006.01)
(Continued)

(52) U.S. Cl.
CPC .............. *H02M 7/1555* (2013.01); *H02M 7/06* (2013.01); *H02M 7/217* (2013.01); *H03K 17/567* (2013.01); *H05B 39/08* (2013.01)

(58) Field of Classification Search
CPC ..................... H02M 5/293; H02M 2005/2935; G05F 1/455; H05B 39/048
USPC ................. 323/207, 225, 237, 244, 319, 320; 363/25, 39, 47, 54, 68; 315/194, 209 R, 315/246, 287, 291, 307, 360
See application file for complete search history.

(56) References Cited

U.S. PATENT DOCUMENTS 5,004,969 A * 4/1991 Schanin .................. G05F 1/455
323/235
5,359,278 A * 10/1994 Notohara ................ G05F 1/613
323/222
(Continued)

FOREIGN PATENT DOCUMENTS

GB 2 435 724 A 9/2007
JP 2001-250699 A 9/2001
(Continued)

OTHER PUBLICATIONS

French Search Report and Written Opinion dated Jul. 4, 2012 from corresponding French Application No. 11/60367.
(Continued)

*Primary Examiner* — Rajnikant Patel
(74) *Attorney, Agent, or Firm* — Seed IP Law Group PLLC

(57) ABSTRACT

A control circuit varies the power of a load powered by an alternating voltage, comprising: a first thyristor and a first diode connected in antiparallel between first and second nodes, the cathode of the first diode being on the side of the first node; a second thyristor and a second diode connected in antiparallel between the second node and a third node, the cathode of the second diode being on the side of the third node; third and fourth diodes connected in antiseries between the first and third nodes, the cathodes of the third and fourth diodes being connected to a fourth node; a transistor between the second and fourth nodes; and a control unit for controlling the first and second thyristors and the transistor.

20 Claims, 2 Drawing Sheets

(51) Int. Cl.
*H03K 17/567* (2006.01)
*H05B 39/08* (2006.01)
*H02M 7/06* (2006.01)
*H02M 7/217* (2006.01)

(56) References Cited

U.S. PATENT DOCUMENTS

| | | | | |
|---|---|---|---|---|
| 5,621,628 | A * | 4/1997 | Miyazaki | H02M 5/45 363/37 |
| 5,982,646 | A * | 11/1999 | Lyons | H02M 1/34 363/128 |
| 6,563,726 | B1 * | 5/2003 | Hirst | H02M 7/219 363/127 |
| 6,900,601 | B2 * | 5/2005 | Peron | H02M 1/088 315/194 |
| 7,295,785 | B2 * | 11/2007 | Takahashi | G08C 23/04 398/202 |
| 2004/0135618 | A1 * | 7/2004 | Peron | H02M 1/088 327/403 |

FOREIGN PATENT DOCUMENTS

| | | |
|---|---|---|
| JP | 2001250699 A | 9/2001 |
| JP | 2001338789 A | 12/2001 |

OTHER PUBLICATIONS

English Translation of the Written Opinion of the International Searching Authority dated May 30, 2014 from corresponding International Application No. PCT/FR2012/052555.
US 4,546,308, 10/1985, Widmayer (withdrawn)

* cited by examiner

POWER DIMMER

CROSS REFERENCE TO RELATED APPLICATIONS

This application is the U.S. National Stage of international patent application number PCT/FR2012/052555, filed on Nov. 6, 2012 which claims the benefit of French patent application No. 11/60367, filed on Nov. 15, 2011, which is hereby incorporated by reference to the maximum extent allowable by law.

BACKGROUND

1. Technical Field

The present disclosure generally relates to electronic circuits. It more specifically relates to power dimmers intended to control a load (for example, a lighting device) powered from an A.C. voltage (generally, the mains voltage of the electric distribution network).

2. Discussion of the Related Art

Among known power dimmers, some use a triac in series with the load, the assembly receiving the A.C. power supply voltage, and a microcontroller for controlling the triac.

To power the microcontroller, the dimmer generally comprises a circuit providing a D.C. voltage across a storage capacitor. This circuit, for example, comprises a diode for rectifying the A.C. voltage to charge the capacitor, and a zener diode for setting the value of the D.C. voltage across the capacitor.

In operation, the triac is turned on at an intermediate stage between the beginning and the end of each positive and/or negative halfwave of the power supply voltage, by application of a start pulse on its gate. Once started, the triac remains on until the end of the ongoing halfwave. By varying the time of application of the start pulse, it is possible to regulate the power supplied to the load. In particular, a starting at the beginning of a halfwave of the power supply voltage amounts to supplying more power than a starting at the end of a halfwave.

One of the issues with the use of a triac lies in the fact that switchings are relatively abrupt, and are thus capable of causing unwanted current and/or voltage gradients (for example, current and/or voltage peaks) across the triac or the load. To avoid the propagation of such gradients on the electric power distribution network, it is necessary to provide an LC filter between the triac and terminals of connection to the dimmer network, which increases the bulk and the cost of the dimmer.

The LC filter may further result in malfunctions of the dimmer. Indeed, if the LC filter attenuates the amplitude of parasitic disturbances in switchings of the triac, it causes as in return, for a short time after each switching of the triac, local oscillations of the current flowing through the triac. Such oscillations, when they occur after a switching from the off state to the on state, may carry on for a time longer than the time of application of the turn-on pulse to the triac gate. There then is a risk that the current flowing through the triac will temporarily cancel due to the oscillations, thus causing a blocking of the triac almost immediately after its starting (triac uncoupling). The load then no longer receives the prescribed power during the considered halfwave.

Another disadvantage of the LC filter is that the inductance may emit an unwanted acoustic noise (crackling) each time it is submitted to a significant current variation, that is, on each starting of the triac.

Another problem of dimmers using a triac or another power component controlled by a microprocessor has to do with the microcontroller power supply. In the case of a dimmer using a triac, at the beginning of each halfwave (positive and/or negative) of the A.C. power supply voltage, although no current flows through the triac (since it has not been started yet), a current however flows through the dimmer, pulled by the microcontroller power supply circuit to recharge the storage capacitor. This current is not negligible since on each starting of the triac, the microcontroller should apply a current of relatively high value, for example, on the order of 5 mA or more, on the triac gate. The microcontroller power supply circuit and the storage capacitor should be sized accordingly. An issue is that for low power consumption loads, for example certain light-emitting diode lamps or certain low-power compact fluorescent lamps (for example, with a power lower than 10 watts), the microcontroller power supply current sampled by the dimmer at the beginning of each halfwave of the mains power supply voltage may turn on the load. As a result, in practice, dimmers using a triac generally cannot be used to control low-power loads. In the case where a power component other than a triac is controlled by the microcontroller, the microcontroller power supply current is not necessarily pulled at the beginning of a halfwave, but the same issue remains.

SUMMARY

An embodiment provides a power dimmer capable of controlling a load powered with an A.C. voltage, this dimmer overcoming at least some of the disadvantages of known dimmers.

An embodiment provides a power dimmer compatible with low power consumption loads such as light-emitting diodes or compact fluorescent lamps.

An embodiment provides a method for controlling a power dimmer.

Thus, an embodiment provides a circuit for controlling the power variation of a load powered with an A.C. voltage, comprising: a first thyristor and a first diode in antiparallel between first and second nodes, the cathode of the first diode being on the side of the first node; a second thyristor and a second diode in antiparallel between the second node and a third node, the cathode of the second diode being on the side of the third node; third and fourth diodes in antiseries between the first and third nodes, the cathodes of the third and fourth diodes being connected to a fourth node; a transistor between the second and fourth nodes; and a unit for controlling the first and second thyristors and the transistor.

According to an embodiment, the control unit is configured for: at a first time of a halfwave of the A.C. voltage, turning on the transistor; and at a second time of the halfwave, subsequent to the first time, turning on the first and/or the second thyristor.

According to an embodiment, the transistor is an insulated-gate transistor.

According to an embodiment, the first and second thyristors are cathode-gate thyristors.

According to an embodiment, the transistor is an insulated-gate bipolar transistor.

According to an embodiment, the above-mentioned circuit further comprises a circuit for powering the control unit, the power supply circuit being connected to the fourth node, on the one hand, and to a first electrode of a storage capacitor, on the other hand, the second electrode of the capacitor being connected to the second node.

According to an embodiment, the anodes of the first and second diodes are common and are directly connected to the second node, the cathodes of the first and second thyristors being common and connected to the second node via an inductance.

According to an embodiment, the growth rate of the current in the transistor during switchings of this transistor from the off state to the on state ranges between 50 and 300 amperes per millisecond.

According to an embodiment, the first and second thyristors are capable of being started by a gate current lower than 1 mA.

According to an embodiment, the control unit comprises first to third output terminals respectively connected to the gate of the first thyristor, to the gate of the second thyristor, and to the control gate of the transistor.

According to an embodiment, the control unit comprises a first output terminal connected to the gates of the first and second thyristors, and a second output terminal connected to the control gate of the transistor.

Another embodiment provides a method for controlling a circuit of the above-mentioned type, comprising the steps of: at a first time of a halfwave of the A.C. voltage, turning on the transistor; at a second time of the halfwave, subsequent to the first time, turning on the first or second thyristor.

According to an embodiment, the D.C. turn-on control signal is applied to one of the first and second thyristors from the second time and at least until a time of inversion of the sign of the current in the load.

According to an embodiment, a D.C. turn-on control signal is applied to the first thyristor and to the second thyristor from the second time and at least until a time of inversion of the sign of the current in the load.

According to an embodiment, from 20 to 200 µs separate the first time from the second time.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

Figure 1:
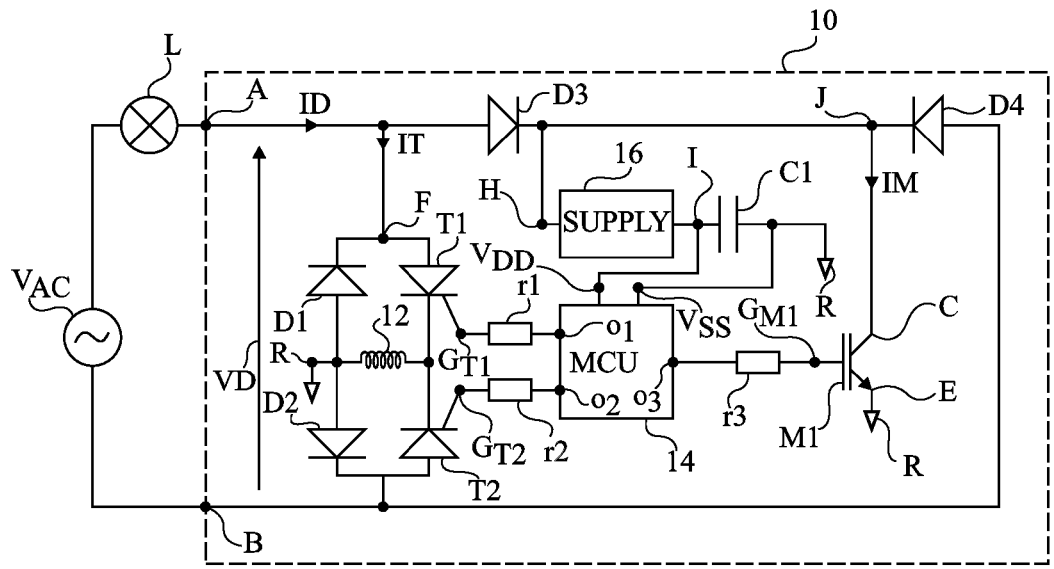
FIG. 1 is a simplified electric diagram of an assembly comprising a load powered with an A.C. voltage, and an embodiment of a power dimmer capable of controlling the load.

The same elements have been designated with the same reference numerals in the different drawings. For clarity, only those elements which are useful to the understanding of the embodiments have been shown and will be described hereafter. Further, FIGS. 2A to 2E and FIG. 3 have been drawn out of scale.

FIG. 1 is a simplified electric diagram of an assembly comprising a load L powered with an A.C. voltage $V_{AC}$, and an embodiment of a power dimmer 10 capable of controlling load L.

In the shown example, load L is a lighting device, for example, a halogen bulb, a light-emitting diode lamp, a compact fluorescent lamp, or any other lighting device capable of being powered with an A.C. voltage. A.C. voltage $V_{AC}$ for example is the mains voltage of the electric distribution network.

Dimmer 10 is assembled in series with load L via two nodes or contact terminals A and B, all receiving A.C. voltage $V_{AC}$. In the shown example, terminal A of the dimmer is connected to a first terminal of load L, and terminal B of the dimmer is connected to a first terminal of provision of A.C. voltage $V_{AC}$, a second terminal of load L being connected to a second terminal of provision of A.C. voltage $V_{AC}$.

Dimmer 10 comprises a thyristor T1 and a diode D1 in antiparallel between a node F and a node R, node F being connected to node A, and node R defining a reference common to several components of the dimmer. In this example, thyristor T1 is a cathode-gate thyristor. The cathode of diode D1 and the anode of thyristor T1 are on the side of node F, and the anode of diode D1 and the cathode of thyristor T1 are on the side of node R. Dimmer 10 further comprises, between node R and node B, a thyristor T2, also having a cathode gate in the present example, and a diode D2 assembled in antiparallel with thyristor T2. The cathode of diode D2 and the anode of thyristor T2 are on the side of node B, and the anode of diode D2 and the cathode of thyristor T2 are on the side of node R. Diodes D1 and D2 may be either discrete components, or diodes intrinsic to thyristors T1 and T2, respectively.

In one embodiment, the cathode of diode D1 and the anode of thyristor T1 are directly connected to node F, node F being directly connected to node A, and the cathode of diode D2 and the anode of thyristor T2 are directly connected to node B. Further, the anode of diode D1 and the anode of diode D2 are directly connected to node R, and the cathode of thyristor T1 is directly connected to the cathode of thyristor T2, an inductance 12 connecting the cathodes of thyristors T1 and T2 to the anodes of diodes D1 and D2 (and thus to node R).

In parallel with the branch comprising inductance 12, thyristors T1 and T2, and diodes D1 and D2, dimmer 10 comprises two diodes D3 and D4 in antiseries between node A and node B. The anode of diode D3 is on the side of node A and the anode of diode D4 is on the side of node B, the cathodes of diodes D3 and D4 being connected to a same node J of the dimmer. In one embodiment, the anodes of diodes D3 and D4 are directly connected, respectively, to node A and to node B, and the cathodes of diodes D3 and D4 are directly connected to node J.

Dimmer 10 further comprises a transistor M1 having its conduction electrodes respectively connected to node J and to node R. In one embodiment, the conduction electrodes of transistor M1 are directly connected, respectively, to node J and to node R. Transistor M1 preferably is an insulated-gate transistor, for example, a MOS transistor or an insulated-gate bipolar transistor (IGBT). In this example, transistor M1 is an insulated-gate bipolar transistor (IGBT) having its collector C connected to node J and emitter E is connected to node R.

Dimmer 10 further comprises a unit 14 (MCU) for controlling thyristors T1 and T2 and transistor M1, for example, a microcontroller having output terminals connected to control gates $G_{T1}$ and $G_{T2}$ of thyristors T1 and T2 and to control gate $G_{M1}$ of transistor M1. In this example, three output terminals $o_1$, $o_2$, and $o_3$ of control unit 14 are respectively connected to cathode gate $G_{T1}$ of thyristor T1 via a resistor r1, to cathode gate $G_{T2}$ of thyristor T2 via a resistor r2, and to gate $G_{M1}$ of transistor M1 via a resistor r3.

To power control unit 14, dimmer 10 comprises a power supply circuit 16 (SUPPLY) delivering a D.C. voltage across a storage capacitor C1. Power supply circuit 16 is connected by first and second terminals H and I, respectively to node J and to a first electrode of capacitor C1. The second electrode of capacitor C1 is connected to common reference node R of the dimmer. High and low power supply terminals $V_{DD}$ and $V_{SS}$ of control unit 14 are respectively connected to nodes I and R (that is, respectively, to the positive electrode and to the negative electrode of capacitor C1). Circuit 16, which is not detailed in FIG. 1, for example comprises a zener diode to set the value of the D.C. voltage across capacitor C1, diodes D1, D2, D3, and D4 behaving as rectification diodes for A.C. voltage $V_{AC}$. Any other power supply circuit capable of delivering a D.C. voltage to control unit 14 may be used.

FIGS. 2A to 2E and FIG. 3 enable to better understand the operation of dimmer 10 of FIG. 1.

Figure 2A:
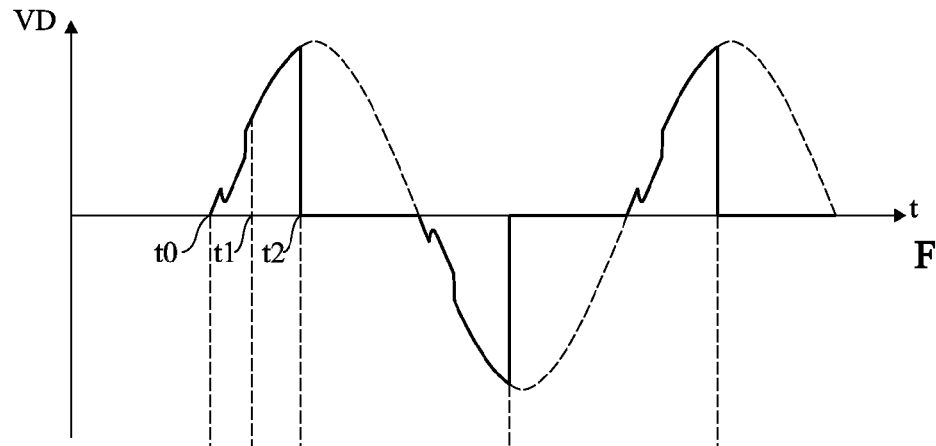
FIGS. 2A to 2E are timing diagrams illustrating the variation of signals (current/voltage) at different points of the dimmer of FIG. 1.
Figure 2B:
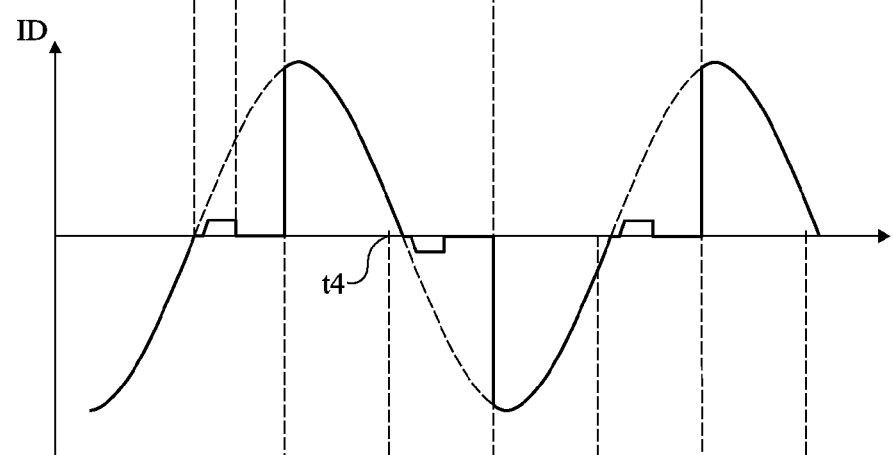
Figure 2C:
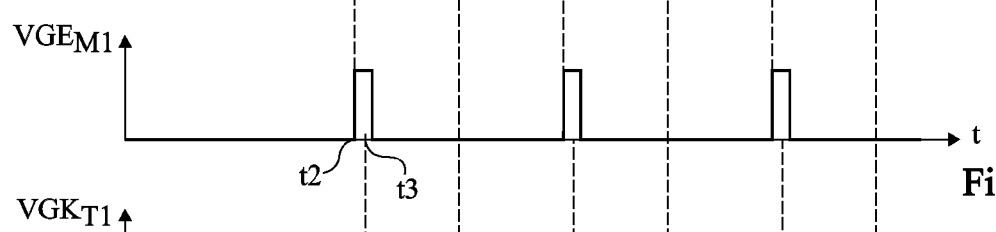
Figure 2D:
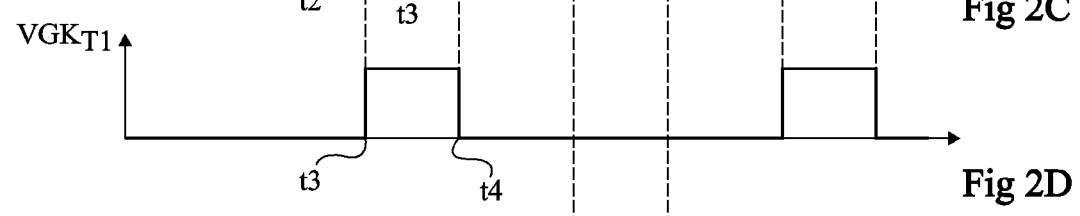
Figure 2E:
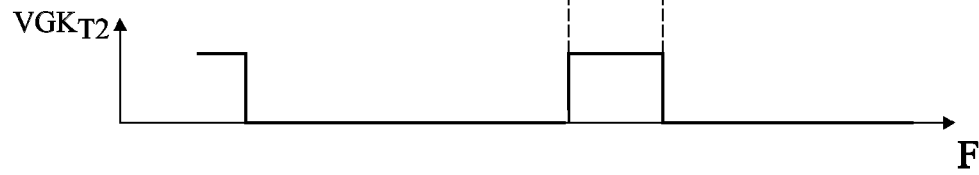

FIGS. 2A to 2E are timing diagrams illustrating the variation of signals (current/voltage) at different points of dimmer 10 of FIG. 1 during its operation. FIGS. 2A and 2B respectively illustrate the variation of voltage VD and of current ID at the input of dimmer 10, that is, between terminals A and B. FIGS. 2C, 2D, and 2E respectively illustrate the variation of voltages $VGE_{M1}$, $VGK_{T1}$, and $VGK_{T2}$ applied by control unit 14 respectively between gate $G_{M1}$ and emitter E of transistor M1, between cathode gate $G_{T1}$ and the cathode of thyristor T1, and between cathode gate $G_{T2}$ and the cathode of thyristor T2.

At the beginning of a positive halfwave of voltage $V_{AC}$, transistor M1 and thyristors T1 and T2 are maintained off (substantially zero voltages $VGE_{M1}$, $VGK_{T1}$, and $VGK_{T2}$ in the present example). Between a time t0 of beginning of the halfwave and a time t1 subsequent to time t0, dimmer 10 conducts a current ID corresponding to the current pulled by circuit 16 for powering control unit 14 for recharging storage capacitor C1. During this period, a slight uncoupling of voltage VD across the dimmer can be observed, that is, voltage VD remains slightly lower than power supply voltage $V_{AC}$.

Between time t1 and an intermediate time t2 ranging between t1 and the end of the halfwave, capacitor C1 being charged and transistor M1 and thyristors T1 and T2 being still off, no current flows through dimmer 10. Voltage VD across the dimmer then closely follows A.C. power supply voltage $V_{AC}$.

At a time t2, transistor M1 is turned on. To achieve this, control unit 14 applies a gate-emitter voltage $VGE_{M1}$ greater than the transistor threshold voltage. As soon as transistor M1 turns on, a current ID flows in the dimmer, and thus in load L, through diode D3, transistor M1, reference node R, and diode D2.

At a time t3, little after time t2, for example, from 20 to 200 µs after time t2, thyristor T1 is turned on. To achieve this, control unit 14 applies a voltage $VGK_{T1}$ between the cathode gate resistor and the cathode of thyristor T1, to apply a current having an intensity greater than a start threshold between the cathode gate and the thyristor cathode. As soon as thyristor T1 turns on, the voltage drop across thyristor T1 and diode D2 being smaller than the voltage drop across diode D3, transistor M1, and diode D2, current ID flowing through the dimmer stops running through diode D3, transistor M1, and diode D2, and starts running through thyristor T1, inductance 12, and diode D2. In this example, little after time t3, for example, from a few tens to a few hundreds of microseconds after time t3, transistor M1 is off. Once started, thyristor T1 remains on until the end of the halfwave. To avoid the risk of uncoupling of thyristor T1 in the event where a parasitic voltage peak would result in canceling the voltage thereacross before the end of the halfwave, it may be provided to maintain a signal for controlling the turning-on of thyristor T1 (positive voltage $VGK_{T1}$) until a time t4 (subsequent to time t3) close to the end of the halfwave. As a variation, it may also be provided to maintain the signal for controlling the turning-on of thyristor T1 until the end of the halfwave (beginning of the next halfwave, or even until little after the end of the next halfwave). This enables to guarantee that the gate current is maintained until the current flowing through the load cancels, which may occur with a delay for inductive loads (motor, etc.).

The above-mentioned sequence is repeated for each positive or negative halfwave of A.C. voltage $V_{AC}$, the only difference, for negative halfwaves, being that between times t2 and t3, thyristor T1 is maintained off, and thyristor T2 is turned on by application of a positive voltage $VGK_{T2}$ between its cathode gate resistor and its cathode. During negative halfwaves, the current flowing through the dimmer thus runs through diode D4, transistor M1, and diode D1 between times t2 and t3, and through thyristor T2 and diode D1 between time t3 and the end of the halfwave.

By varying starting times t2 and t3 of the dimmer (via transistor M1 to begin with, and then via thyristor T1 or T2 little after), it is possible to regulate the power delivered to load L. In particular, a starting at the beginning of a halfwave (t2 close to t0) amounts to providing the load with a greater power than a starting at the end of a halfwave (t2 close to the end of the halfwave).

An advantage of dimmer 10 described in relation with FIG. 1 and of the method for controlling this dimmer described in relation with FIGS. 2A to 2E, is that switchings of the dimmer from the off state to the on state are less abrupt than those of a dimmer using a triac. Indeed, in an insulated-gate transistor (or another transistor controlled to be turned on), the current growth rate at the switching from the off state to the on state is controllable, and may be made less abrupt than in a triac or a thyristor. The control of the growth rate may be achieved by controlling the gate voltage charge speed (for a MOS transistor) or the base current variation speed (for a bipolar transistor).

In dimmer 10, the intermediate step of turning on transistor M1 before turning on thyristor T1 or T2 enables to smooth the switching, while keeping the advantage of a low voltage drop linked to the use of a thyristor during the most part of the dimmer conduction phase.

Figure 3:
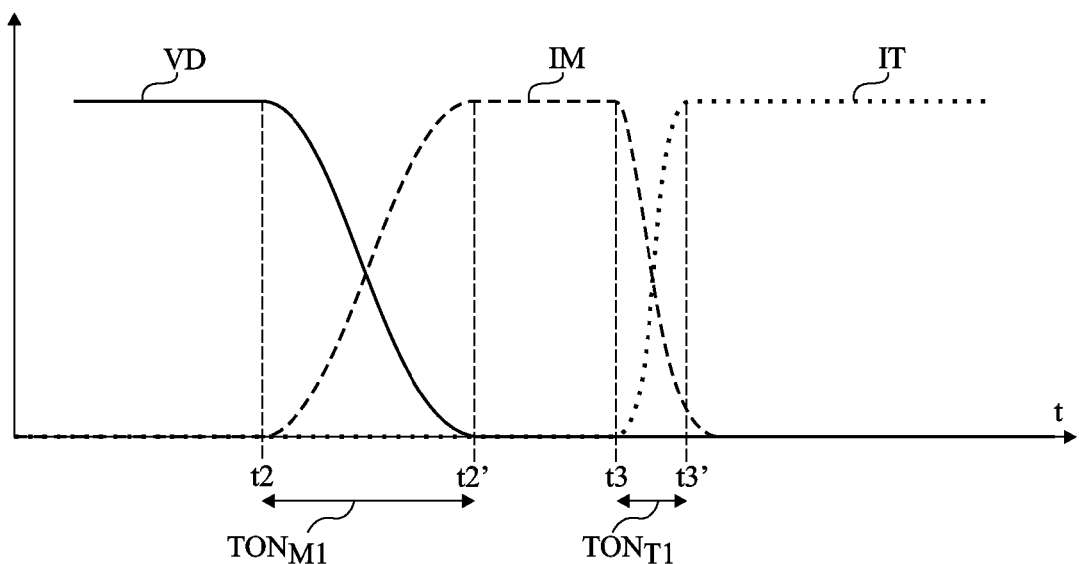
FIG. 3 is a timing diagram illustrating in more detail the variation of signals (voltage/current) at different points of the dimmer of FIG. 1.

FIG. 3 is a timing diagram illustrating this phenomenon in more detailed fashion. FIG. 3 shows in more detailed fashion the variation of signals (voltage/current) at different points of the dimmer in a switching of the dimmer from the off state to the on state, during a positive halfwave of power supply voltage $V_{AC}$. More specifically, FIG. 3 shows the variation, in the case of a resistive load, of voltage VD across the dimmer (full line curve), of current IM in transistor M1 (dashed curve), and of current IT in the branch comprising diodes D1 and D2, thyristors T1 and T2, and inductance 12 (dotted curve).

At time t2 (see FIGS. 2A to 2E), transistor M1 is turned on. Between time t2 and a time t2' subsequent to time t2, current IM flowing through transistor M1 increases from a substantially zero value (off transistor) to a high value, substantially corresponding to the current delivered by A.C. power supply source $V_{AC}$ (on transistor) to the load. At the same time, voltage VD across the dimmer decreases from a high value, substantially corresponding to A.C. power supply voltage $V_{AC}$ (possibly minus the voltage drop of the load), down to a substantially zero value (to within the voltage drop of diode D3 and of transistor M1).

At time t3, preferably subsequent to time t2', and little after time t2, for example, from 20 to 200 µs after time t2, thyristor T1 is turned on. Between time t3 and a time t3' subsequent to time t3, current IT flowing through thyristor T1 increases from a substantially zero value to a high value, substantially corresponding to the current delivered by A.C. power supply source $V_{AC}$. At the same time, current IM flowing through transistor M1 decreases from a high value to a substantially zero value.

As appears in FIG. 3, the growth rate of current IM in transistor M1 in interval $TON_{M1}$ between times t2 and t2', corresponding to the time of switching of transistor M1 from the off state to the on state, is much smaller than the growth rate of current IT in thyristor T1 in interval $TON_{T1}$ between times t3 and t3', corresponding to the time of switching of thyristor T1 from the off state to the on state (possibly slowed down by inductance 12, if present).

It should be noted that the growth rate of the current in transistor M1 may be set, for example, by varying the value of resistor r3 connecting gate $G_{M1}$ of transistor M1 to the corresponding output terminal $o_3$ of control unit 14. Optionally, a capacitance approximately ranging between 1 and 50 nF may be connected between the gate and the emitter of transistor M1 (in the case of an insulated-gate transistor) to slow down the switching. According to an aspect of the described embodiment, the growth rate of the current in transistor M1 is selected to be small enough to avoid for parasitic current/voltage peaks and gradients capable of causing disturbances on the electric network to occur during switchings of the dimmer. An LC filter of the type currently used in dimmers using a triac can then be omitted at the dimmer input. As an example, the growth rate of the current in transistor M1 is set to a value ranging between 50 and 300 amperes per millisecond. As a comparison, the growth rate of the current in dimmers using a triac is generally on the order of from 10 to 50 amperes per microsecond (in the absence of an LC filter).

It should be noted that the voltage drop across thyristor T1 and diode D2 or across thyristor T2 and diode D1, is lower than the voltage drop across transistor M1 and diode D3 or D4. A function of inductance 12 is to absorb the voltage peak capable of occurring at time t3, when current ID stops flowing through transistor M1 to flow through thyristor T1 or T2. In all cases, the value of inductance 12, for example, ranging from 1 to 10 µH, is low as compared with inductances of LC filters usually provided in dimmers using a triac, that is, on the order of 1 mH or more. As a variation, inductance 12 may be omitted and the cathodes of thyristors T1 and T2 may be connected to node R (and thus to the anodes of diodes D1 and D2). In another variation, a capacitor (not shown) may be provided between terminals A and B of the dimmer (instead of inductance 12 or as a complement to inductance 12), to absorb peaks that may occur on starting of thyristor T1 or T2, and/or to immunize the dimmer against the mains noise. In all cases, the value of this capacitance, for example, ranging between 1 and 50 nF, is low as compared with the capacitances of LC filters usually provided in dimmers using a triac.

In other words, an advantage of the embodiment described in relation with FIGS. 1 to 3 is that it enables either to do without the LC filter usually provided in power dimmers using a triac, or to considerably decrease the dimensions of this filter.

Other positions of inductance 12 may be envisaged.

In a first example, inductance 12 may, as in the example described in relation with FIG. 1, connect the anodes of diodes D1 and D2 to the cathodes of thyristors T1 and T2, node R being this time directly connected to the cathodes of thyristors T1 and T2 and not to the anodes of diodes D1 and D2.

In a second example, inductance 12 may be placed between load L and node A.

In a third example, inductance 12 may be placed between node F and the anode of thyristor T1, a second identical or equivalent inductance being placed between node B and the anode of thyristor T2.

In a fourth example, inductance 12 may be placed between node F and node A.

More generally, it will be within the abilities of those skilled in the art to provide other adapted configurations of inductance 12, it being understood that inductance 12, if provided, must be placed on the path of the current flowing through the dimmer when the branch comprising thyristors T1 and T2 and diodes D1 and D2 is conductive.

In one embodiment, thyristors T1 and T2 are high-sensitivity thyristors, that is, they require but a low gate current, for example, a current lower than 1 mA, and preferably lower than 0.5 mA, to be started. By comparison, triacs currently used in power dimmers require, to be started, a gate current on the order of 5 mA or more. The use of high-sensitivity thyristors enables to significantly decrease the power consumption of control unit 14. Dimmer 10 can thus be used to control loads of very low power consumption, without for the power supply current of control unit 14, flowing through the dimmer at the beginning of each halfwave of voltage $V_{AC}$, to start the load.

The use of high-sensitivity thyristors further enables to apply a D.C. signal for controlling the turning-on of thyristor T1 or T2 between time t3 and time t4 (where time t4 may be confounded with the end of the halfwave, or even be subsequent to the end of the halfwave), without for all this to cause an excessive power overconsumption by control unit 14. The present inventors have observed that when a D.C. turn-on control (rather than a pulse-type control) is used, dimmer 10 is compatible with loads of low power, for example, smaller than 10 watts. As a comparison, the use of a D.C. turn-on control signal in a dimmer using a triac would inevitably make this dimmer incompatible with loads of low or average power, due to the excessive current which would be sampled for the power supply of the triac control circuit.

Another advantage is that, due to the presence of diodes D3 and D4, capacitor C1 of dimmer 10 may be charged during the two positive and negative halfwaves of voltage $V_{AC}$. Diodes D3 and D4 further enables to use a single transistor M1 to control the dimmer during the two positive and negative halfwaves of voltage $V_{AC}$.

Another advantage of dimmer 10 is the provision of a floating reference R common to transistor M1, to thyristors T1 and T2, and to control unit 14. The provision of such a reference enables to control the three switches M1, T1, and T2 from a same control unit 14 and to use a single power supply block 16, which enables to form a dimmer only comprising two terminals of connection to the electric network, that is, a dipole (dimmer 10 only comprises two connection terminals, one being connected to a first terminal of the load, the other being connected to a first terminal of application of the A.C. power supply voltage, for example, the neutral, being connected to a second terminal of the load). In particular, it is thus not necessary to use components of opto-triac type, which are relatively expensive, to solve reference issues. It should be noted that the low value of inductance 12 does not significantly disturb reference voltage R for the control of transistor M1 and of thyristors T1 and T2.

Specific embodiments have been described. Various alterations, modifications and improvements will readily occur to those skilled in the art.

In particular, the described embodiments are not limited to the example described in relation with FIG. 1 in which transistor M1 is an IGBT. A MOS transistor or any other insulated-gate transistor may be used rather than an IGBT. The described embodiments are not limited either to the case where transistor M1 is an insulated-gate transistor. Other transistors controlled to be turned on, for example, a bipolar transistor, may be used.

Further, the described embodiments are not limited to the case described in relation with FIG. 1 in which three distinct output terminals of control unit 14 are used to control transistor M1 and thyristors T1 and T2. It may be provided to use a same output terminal of the microcontroller to control thyristors T1 and T2. In this case, during a positive halfwave, a start signal will be applied not only to the gate of thyristor T1, but also to that of thyristor T2. Thyristor T2 being reverse-biased, it will remain off, and the operation will be identical to that described in relation with FIGS. 2A to 2E. In a negative halfwave, a start signal will be applied not only to the gate of thyristor T2, but also to that of thyristor T1. Thyristor T1 being reverse-biased, it will remain off, and the operation will be identical to that described in relation with FIGS. 2A to 2E.

Further, it will be within the abilities of those skilled in the art to adapt dimmer 10 to the case where transistor M1 requires, to be controlled, a different voltage level (for example, higher) than the voltage level required to control thyristors T1 and T2. A step-up transformer (or step-down transformer) may for example be used between output terminal $o_3$ of the microprocessor and the gate of transistor M1.

Further, although the described embodiments are particularly advantageous to control a lighting device, they are not limited to this specific use. Any other load powered with an A.C. voltage may be controlled by a dimmer of the type described in relation with FIGS. 1 to 3.

Further, although this has not been shown in FIG. 1, dimmer 10 may comprise one or several protection fuses, for example, in series with the load, between node A and the node common to the anode of diode D3 and to the cathode of diode D1, or between node B and the node common to the anode of diode D4 and to the cathode of diode D2.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A circuit for controlling a power variation of a load when powered with an A.C. voltage comprising:
   a first thyristor and a first diode electrically coupled between first and second nodes, the first diode having a cathode electrically coupled to the first node and an anode electrically coupled to the second node, the first thyristor having an anode electrically coupled to the first node and cathode electrically coupled to the second node;
   a second thyristor and a second diode electrically coupled between the second node and a third node, the second diode having a cathode electrically coupled to the third node and an anode electrically coupled to the second node, the second thyristor having an anode electrically coupled to the third node and a cathode electrically coupled to the second node;
   third and fourth diodes electrically coupled between the first and third nodes, the third and fourth diodes having respective cathodes directly electrically coupled to a fourth node and respective anodes directly electrically coupled to the first and third nodes, respectively;
   a transistor electrically coupled between the second and fourth nodes; and
   a control unit configured to control the first and second thyristors and the transistor.

2. The circuit of claim 1, wherein the control unit is configured to:
   turn on the transistor at a first time of a halfwave of the A.C. voltage, turning on the transistor; and
   turn on at least one of the first and second thyristors at a second time of the halfwave, subsequent to the first time.

3. The circuit of claim 1, wherein the transistor is an insulated-gate transistor.

4. The circuit of claim 1, wherein the first and second thyristors are cathode-gate thyristors.

5. The circuit of claim 1, wherein the transistor is an insulated-gate bipolar transistor.

6. The circuit of claim 1, comprising:
   a storage capacitor having first and second electrodes: and
   a power supply circuit configured to power the control unit, the power supply circuit being electrically coupled to the fourth node and to the first electrode of the storage capacitor, the second electrode of the capacitor being electrically coupled to the second node.

7. The circuit of claim 1, further comprising an inductance, wherein the anodes of the first and second diodes are connected in common and are directly connected to the second node, the cathodes of the first and second thyristors being connected in common and electrically coupled to the second node via the inductance.

8. The circuit of claim 1, wherein the control unit is configured to control the transistor in a manner that provides a growth rate of current in the transistor during switchings of the transistor from an off state to an on state that ranges between 50 and 300 amperes per millisecond.

9. The circuit of claim 1, wherein the first and second thyristors are capable of being started by a gate current lower than 1 mA.

10. The circuit of claim 1, wherein the control unit comprises first, second, and third output terminals respectively electrically coupled to a gate of the first thyristor, to a gate of the second thyristor, and to a control gate of the transistor.

11. The circuit of claim 1, wherein the control unit comprises a first output terminal electrically coupled to respective gates of the first and second thyristors, and a second output terminal electrically coupled to a control gate of the transistor.

12. A method for controlling the circuit of claim 1, comprising the steps of:
   at a first time of a halfwave of the A.C. voltage, turning on the transistor;
   at a second time of the halfwave, subsequent to the first time, turning on the first or second thyristor.

13. The method of claim 12, wherein the control unit applies a D.C. turn-on control signal to one of the first and second thyristors from the second time and at least until a time of inversion of a current in the load.

14. The method of claim 12, wherein the control unit applies a D.C. turn-on control signal to the first thyristor and to the second thyristor from the second time and at least until a time of inversion of a current in the load.

15. The method of claim 12, wherein a period ranging from 20 μs to 200 μs separates the first time from the second time.

16. A circuit for controlling a power variation of a load when powered with an A.C. voltage comprising:
   a first thyristor and a first diode electrically coupled between first and second nodes, the first diode having a cathode electrically coupled to the first node and an anode electrically coupled to the second node, the first thyristor having an anode electrically coupled to the first node and cathode electrically coupled to the second node;

a second thyristor and a second diode electrically coupled between the second node and a third node, the second diode having a cathode electrically coupled to the third node and an anode electrically coupled to the second node, the second thyristor having an anode electrically coupled to the third node and a cathode electrically coupled to the second node;

third and fourth diodes electrically coupled between the first and third nodes, the third and fourth diodes having respective cathodes electrically coupled to a fourth node and respective anodes electrically coupled to the first and third nodes, respectively;

a transistor electrically coupled between the second and fourth nodes;

an inductance electrically coupled to the second node, the respective cathodes of the first and second thyristor being electrically coupled to the second node via the inductance; and a control unit configured to control the first and second thyristors and the transistor.

17. The circuit of claim 16, wherein the control unit is configured to:

turn on the transistor at a first time of a halfwave of the A.C. voltage, turning on the transistor; and turn on at least one of the first and second thyristors at a second time of the halfwave, subsequent to the first time.

18. The circuit of claim 16, comprising:

a storage capacitor having first and second electrodes: and a power supply circuit configured to power the control unit, the power supply circuit being electrically coupled to the fourth node and to the first electrode of the storage capacitor, the second electrode of the capacitor being electrically coupled to the second node.

19. The circuit of claim 16, wherein the control unit comprises first, second, and third output terminals respectively electrically coupled to a gate of the first thyristor, to a gate of the second thyristor, and to a control gate of the transistor.

20. The circuit of claim 16, wherein the control unit comprises a first output terminal electrically coupled to respective gates of the first and second thyristors, and a second output terminal electrically coupled to a control gate of the transistor.

* * * * *